(12) United States Patent
Mizuno et al.

(10) Patent No.: US 11,490,513 B2
(45) Date of Patent: Nov. 1, 2022

(54) METAL BASE CIRCUIT BOARD AND METHOD OF MANUFACTURING THE METAL BASE CIRCUIT BOARD

(71) Applicant: NHK SPRING CO., LTD., Yokohama (JP)

(72) Inventors: Katsumi Mizuno, Yokohama (JP); Daiki Ikeda, Yokohama (JP)

(73) Assignee: NHK SPRING CO., LTD., Yokohama (JP)

(*) Notice: Subject to any disclaimer, the term of this patent is extended or adjusted under 35 U.S.C. 154(b) by 0 days.

(21) Appl. No.: 15/666,540

(22) Filed: Aug. 1, 2017

(65) Prior Publication Data

US 2017/0332488 A1 Nov. 16, 2017

Related U.S. Application Data

(63) Continuation of application No. PCT/JP2016/052305, filed on Jan. 27, 2016.

(30) Foreign Application Priority Data

Feb. 2, 2015 (JP) .............................. JP2015-018744

(51) Int. Cl.
*H05K 1/05* (2006.01)
*H05K 1/02* (2006.01)
(Continued)

(52) U.S. Cl.
CPC ........... *H05K 1/056* (2013.01); *H05K 1/0256* (2013.01); *H05K 1/0373* (2013.01); *H05K 3/20* (2013.01);
(Continued)

(58) Field of Classification Search
CPC ........ H05K 1/056; H05K 3/20; H05K 1/0373; H05K 3/44; H05K 2203/1105; H05K 2201/0137
See application file for complete search history.

(56) References Cited

U.S. PATENT DOCUMENTS 6,066,386 A * 5/2000 Boyko ................. H01L 21/486
174/255
6,175,084 B1 1/2001 Saitoh et al.
(Continued)

FOREIGN PATENT DOCUMENTS

CN 102598881 A 7/2012
CN 102948264 A 2/2013
(Continued)

OTHER PUBLICATIONS

Machine translation of JP2003-023223, Suzuki et al., Published Jan. 24, 2003.*

(Continued)

*Primary Examiner* — Ishwarbhai B Patel
(74) *Attorney, Agent, or Firm* — Holtz, Holtz & Volek PC

(57) ABSTRACT

According to one embodiment, a metal base circuit board includes a metal base substrate, a first circuit pattern, and a first insulating layer between the metal base substrate and the first circuit pattern. The first insulating layer covers a lower surface of the first circuit pattern and at least part of a side surface of the first circuit pattern, the lower surface facing the metal base substrate, the at least part of the side surface being adjacent to the lower surface.

7 Claims, 3 Drawing Sheets

(51) Int. Cl.
  *H05K 3/30* (2006.01)
  *H05K 3/44* (2006.01)
  *H05K 3/20* (2006.01)
  *H05K 1/03* (2006.01)
  *H05K 3/10* (2006.01)

(52) U.S. Cl.
  CPC ............ *H05K 3/44* (2013.01); *H05K 1/0201* (2013.01); *H05K 1/0263* (2013.01); *H05K 3/103* (2013.01); *H05K 3/202* (2013.01); *H05K 2201/0137* (2013.01); *H05K 2201/09672* (2013.01); *H05K 2201/09727* (2013.01); *H05K 2201/1028* (2013.01); *H05K 2203/0278* (2013.01); *H05K 2203/1105* (2013.01)

(56) References Cited

U.S. PATENT DOCUMENTS

| | | | | |
|---|---|---|---|---|
| 6,809,415 B2 * | 10/2004 | Tsukada | ............... | H05K 3/3452 174/257 |
| 2011/0079421 A1 * | 4/2011 | Ko | .......... | H05K 3/465 174/262 |
| 2012/0216946 A1 * | 8/2012 | Hondo | ................ | H05K 3/205 156/182 |
| 2013/0081865 A1 | 4/2013 | Mizuno et al. | | |
| 2015/0118509 A1 | 4/2015 | Mizuno et al. | | |

FOREIGN PATENT DOCUMENTS

| | | | | |
|---|---|---|---|---|
| JP | 09139580 | A | | 5/1997 |
| JP | 2001348488 | A | * | 12/2001 |
| JP | 2003023223 | A | | 1/2003 |
| JP | 2004072003 | A | | 3/2004 |
| JP | 02011181652 | A | * | 9/2011 |
| JP | 2013254803 | A | | 12/2013 |
| JP | 2013254919 | A | | 12/2013 |
| JP | 2013254921 | A | | 12/2013 |
| JP | 02014027226 | A | * | 2/2014 |
| JP | 02014120549 | A | * | 6/2014 |
| JP | 02014192300 | A | * | 10/2014 |
| JP | 02015005588 | A | * | 1/2015 |
| WO | 2014007327 | A1 | | 1/2014 |

OTHER PUBLICATIONS

International Search Report (ISR) and Written Opinion dated Apr. 19, 2016 issued in International Application No. PCT/JP2016/052305.
English translation of the International Preliminary Report on Patentability (IPRP) dated Aug. 17, 2017 which issued in counterpart International Application No. PCT/JP2016/052305.
Japanese Office Action dated Apr. 3, 2018 (and English language translation thereof) issued in counterpart Japanese Application No. 2015-018744.
Chinese Office Action (and English language translation thereof) dated Dec. 18, 2018 issued in counterpart Chinese Application No. 201680008408.0.
Chinese Office Action dated Aug. 1, 2019 (and English translation thereof) issued in Chinese Application No. 201680008408.0.
Chinese Office Action dated Jan. 10, 2020 (and English translation thereof) issued in Chinese Application No. 201680008408.0.

* cited by examiner

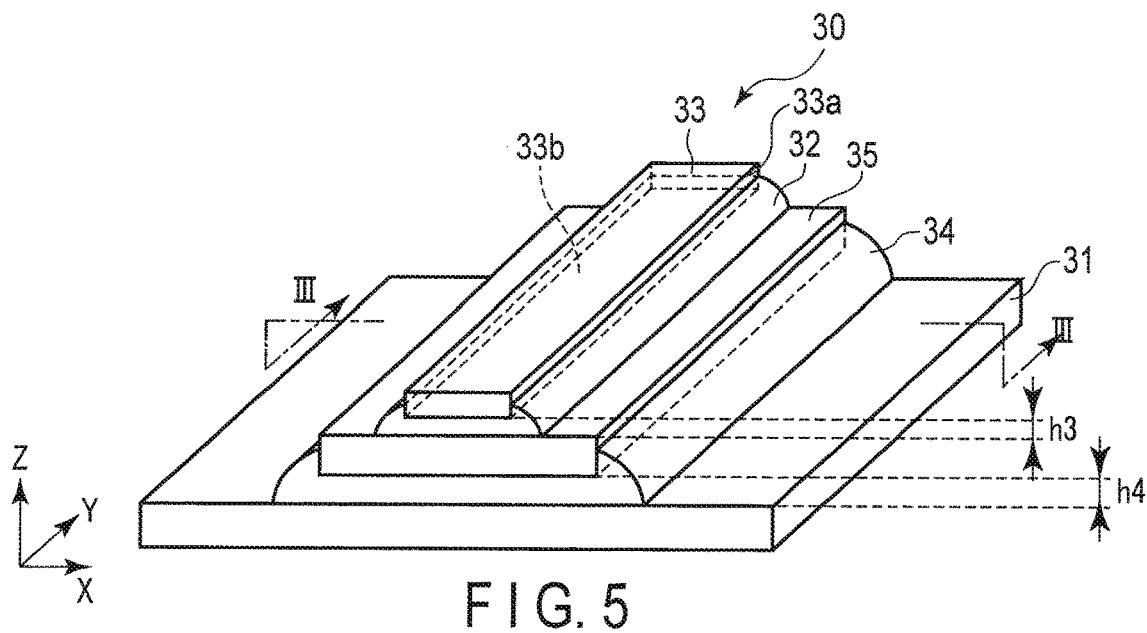
F I G. 5
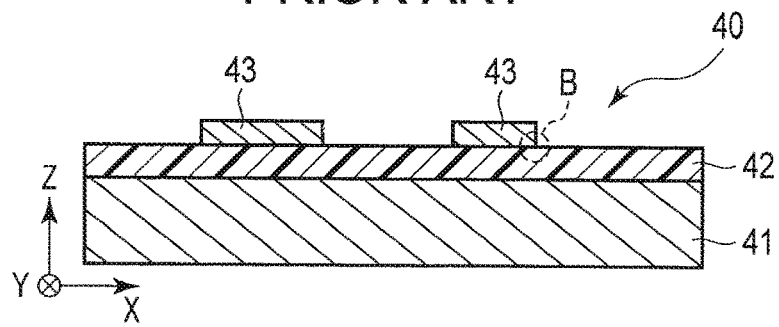
F I G. 7

METAL BASE CIRCUIT BOARD AND METHOD OF MANUFACTURING THE METAL BASE CIRCUIT BOARD

CROSS-REFERENCE TO RELATED APPLICATIONS

This application is a Continuation Application of PCT Application No. PCT/JP2016/052305, filed Jan. 27, 2016 and based upon and claiming the benefit of priority from Japanese Patent Application No. 2015-018744, filed Feb. 2, 2015, the entire contents of all of which are incorporated herein by reference.

FIELD

The present invention relates to a metal base circuit board and a method of manufacturing the metal base circuit board.

BACKGROUND

The progress of electronics technology in recent years is remarkable, and electrical and electronic equipments continue to rapidly become more sophisticated and smaller. In accordance therewith, the amount of heat generation from an electronic element and/or a component in which an electronic element is mounted is becoming larger and larger. In this situation, satisfactory heat resistance and excellent heat dissipating properties and insulating properties are required for metal base circuit boards in which so-called power devices whose typical examples are metal-oxide-semiconductor field-effect transistor (MOSFET), insulated-gate bipolar transistor (IGBT) and the like are mounted. Particularly in the future, silicon carbide (SiC) devices will be increasingly employed. The operating temperature of such devices is much higher than that of the conventional silicon (Si) devices, so that requirement for enhanced heat resistance is anticipated. Moreover, the stress by heat cycle in solder connection areas in which a power device is connected to a metal base circuit board tends to increase, so that it is becoming difficult to ensure durability and solder connection reliability.

The metal base circuit board basically has a structure in which an insulating layer and a circuit pattern are sequentially superimposed on a metal substrate. The insulating layer is required to have excellent electrical insulation properties, heat dissipation properties, heat resistance, adhesiveness, crack resistance and the like. Various ceramics, a resin insulating layer containing an inorganic powder, a resin insulating layer containing glass fiber, a heat-resistant resin insulating layer and the like are used for the insulating layer(for example, refer to Patent Documents 1 and 2, etc.).

Various kinds of multilayer metal base circuit boards have also been developed. For example, in Patent Document 3, an insulating layer having a thickness of 50 μm, which is obtained by curing an epoxy resin containing aluminum oxide, is used as two insulating layers covering each of two metal substrates provided in a multilayer circuit board (Claims and paragraphs 0016, 0018, etc. of Patent Document 3). Further, a multilayer metal circuit board disclosed in Patent Document 4 includes two insulating layers formed of ceramics such as alumina or titania and having a thickness of 300 μm or less (Claims and paragraphs 0012, 0015, etc. of Patent Document 4).

CITATION LIST

Patent Literatures

Patent literature 1: Jpn. Pat. Appln. KOKAI Publication No. 2013-254919
Patent literature 2: Jpn. Pat. Appln. KOKAI Publication No. 2003-23223
Patent literature 3: Jpn. Pat. Appln. KOKAI Publication No. 2004-72003
Patent literature 4: Jpn. Pat. Appln. KOKAI Publication No. 2013-254803

SUMMARY

In order to enhance heat dissipation against heat generated in an electronic device, for example, as disclosed in Patent literatures 1 to 3, a high thermal conductive inorganic filler such as aluminum oxide, silica, or boron nitride is added in an insulating layer constituting a metal base circuit board. In order to further enhance the heat dissipation of the insulating layer, the thickness of the insulating layer is reduced, and a thermally conductive filler is filled to a high level, whereby thermal resistance may be lowered. However, when the insulating layer is used in an electronic device, if the thickness of the insulating layer is reduced and the filling amount of the thermally conductive filler is increased, a path for leakage current is likely to be formed, so that the withstand voltage characteristics are deteriorated. Therefore, if the thickness of the insulating layer is reduced, there is a problem of dielectric breakdown in a short time. In addition, Patent literature 4 discloses that the thickness of a ceramic layer formed of alumina, titania or the like and used as an insulating layer is set to 300 μm or less. However, it is difficult to set the thickness to, for example, 200 μm or less due to problems such as warpage and cracking caused by brittleness of ceramic and stress produced by a heat cycle, and furthermore, an adhesive layer for adhering to a metal layer is required, so that a multilayer results.

An object of the present invention is to solve the above-mentioned problems and to provide a metal base circuit board having excellent withstand voltage characteristics and high insulation reliability even if the thickness of an insulating layer is reduced, and a method of manufacturing the metal base circuit board.

The present invention is, for example, as follows.

[1] A metal base circuit board comprising a metal base substrate, a first circuit pattern, and a first insulating layer between the metal base substrate and the first circuit pattern, wherein the first insulating layer covers a lower surface of the first circuit pattern and at least part of a side surface of the first circuit pattern, the lower surface facing the metal base substrate, the at least part of the side surface being adjacent to the lower surface.

[2] The metal base circuit board according to [1], wherein the thickness of the first insulating layer is 30 to 200 μm.

[3] The metal base circuit board according to [1], wherein the coverage of the side surface of the first circuit pattern with the first insulating layer is 5 to 100%.

[4] The metal base circuit board according to [1], wherein the first insulating layer contains a resin and an inorganic filler.

[5] The metal base circuit board according to [4], wherein the first insulating layer contains at least bisphenol E type cyanate resin as the resin.

[6] The metal base circuit board according to [5], wherein the ratio of the bisphenol E type cyanate resin contained in the first insulating layer is 50% by mass or more based on the total mass of the resin.

[7] The metal base circuit board according to [4], wherein the ratio of the inorganic filler contained in the first insulating layer is 70% by volume or less based on the total volume of the resin.

[8] The metal base circuit board according to [1], further comprising, between the metal base substrate and the first insulating layer, a second insulating layer formed on the metal base substrate, and a second circuit pattern formed on the second insulating layer.

[9] The metal base circuit board according to [8], wherein the second insulating layer covers a lower surface of the second circuit pattern and at least part of a side surface of the second circuit pattern, the lower surface facing the metal base substrate, the at least part of the side surface being adjacent to the lower surface.

[10] The metal base circuit board according to [9], wherein the thickness of the second insulating layer is 30 to 200 μm.

[11] The metal base circuit board according to [9], wherein the coverage of the side surface of the second circuit pattern with the second insulating layer is 5 to 100%.

[12] The metal base circuit board according to any one of [8] to [11], wherein the second insulating layer contains a resin and an inorganic filler.

[13] The metal base circuit board according to [12], wherein the second insulating layer contains at least bisphenol E type cyanate resin as the resin.

[14] The metal base circuit board according to [13], wherein the ratio of the bisphenol E type cyanate resin contained in the second insulating layer is 50% by mass or more based on the total mass of the resin.

[15] The metal base circuit board according to [12], wherein the ratio of the inorganic filler contained in the second insulating layer is 70% by volume or less based on the total volume of the resin.

[16] A method of manufacturing the metal base circuit board according to any one of [1] to [7], the method comprising:

attaching, by pressure, the first circuit pattern to the first insulating layer in an uncured state so that the uncured first insulating layer covers a lower surface of the first circuit pattern and at least part of a side surface of the first circuit pattern, the lower surface facing the metal base substrate, the at least part of the side surface being adjacent to the lower surface; and thermally curing the uncured first insulating layer.

[17] A method of manufacturing the metal base circuit board according to [8], the method comprising:

attaching, by pressure, the first circuit pattern to the first insulating layer in an uncured state so that the uncured first insulating layer covers a lower surface of the first circuit pattern and at least part of a side surface of the first circuit pattern, the lower surface facing the metal base substrate, the at least part of the side surface being adjacent to the lower surface; and thermally curing the uncured first insulating layer.

[18] A method of manufacturing the metal base circuit board according to [9], the method comprising:

attaching, by pressure, the first circuit pattern onto the first insulating layer in an uncured state so that the uncured first insulating layer covers a lower surface of the first circuit pattern and at least part of a side surface of the first circuit pattern, the lower surface facing the metal base substrate, the at least part of the side surface being adjacent to the lower surface;

attaching, by pressure, the second circuit pattern onto the second insulating layer in an uncured state so that the uncured second insulating layer covers a lower surface of the second circuit pattern and at least part of a side surface of the second circuit pattern, the lower surface facing the metal base substrate, the at least part of the side surface being adjacent to the lower surface; and thermally curing the uncured first insulating layer and the uncured second insulating layer.

According to the present invention, it is possible to provide a metal base circuit board having excellent withstand voltage characteristics and high insulation reliability even if the thickness of an insulating layer is reduced, and a method of manufacturing the metal base circuit board.

BRIEF DESCRIPTION OF THE DRAWINGS

FIG. 5 is a cross-sectional perspective view schematically showing a metal base circuit board according to another embodiment of the present invention.

FIG. 7 is a cross-sectional view of a conventional metal base circuit board.

DETAILED DESCRIPTION

Figure 1:
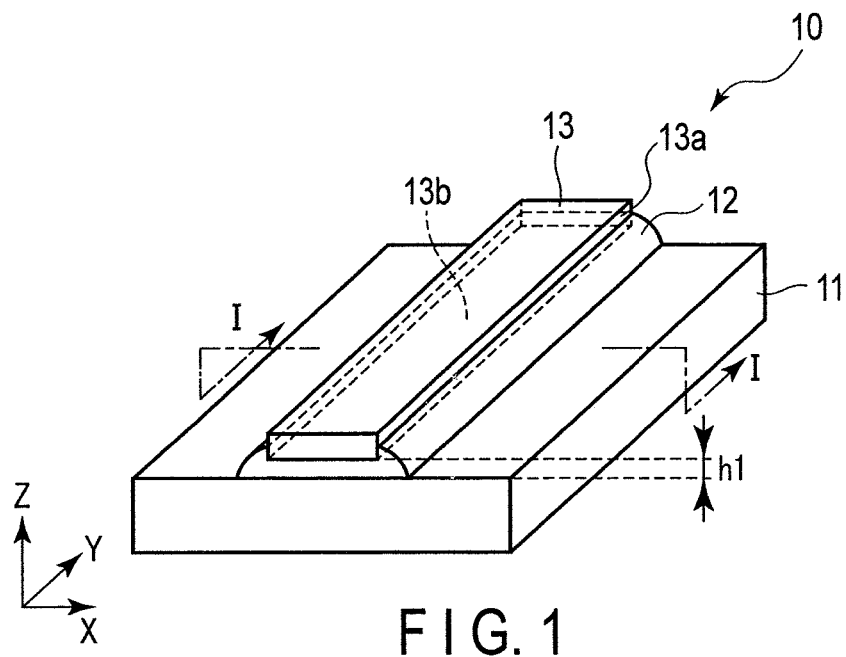
FIG. 1 is a cross-sectional perspective view schematically showing a metal base circuit board according to one embodiment of the present invention.

The inventors of the present invention have analyzed as follows the problem that dielectric breakdown is likely to occur as the thickness of an insulating layer in a metal base circuit board is reduced, and have completed the present invention.

A basic cross-sectional structure of the metal base circuit board is shown in FIG. 7. In this metal base circuit board, when a voltage is applied to a circuit pattern 43, an electric field formed between the circuit pattern 43 and a metal base substrate 41 is particularly high at an end of the circuit pattern 43 (in a broken line frame B which is a rising portion from an insulating layer 42), and partial discharge is likely to occur. In general, the electric field formed between the circuit pattern 43 and the metal base substrate 41 becomes larger as the thickness of the insulating layer 42 is reduced, compared with the case where the thickness is large. Therefore, the smaller the thickness of the insulating layer 42, the more likely it is for the partial discharge to occur at the end of the circuit pattern 43. The partial discharge eventually causes short circuit between the circuit pattern 43 and the metal base substrate 41, thereby causing dielectric breakdown.

A metal base circuit board according to the present invention includes a metal base substrate, a first circuit pattern, and a first insulating layer between the metal base substrate and the first circuit pattern. The primary feature of the invention is that the first insulating layer covers a lower surface of the first circuit pattern, which faces the metal base substrate, and at least part (a rising portion from the first insulating layer) (hereinafter referred to as "the end surface of the first circuit pattern") of a side surface of the first circuit pattern, which is adjacent to the lower surface. In this way, when the present invention provides a structure in which the lower surface of the first circuit pattern and the end surface of the first circuit pattern in the metal base circuit board are covered with the first insulating layer, generation of partial discharge at an end of the first circuit pattern is suppressed, thereby solving the problem of dielectric breakdown in the metal base circuit board. Here, "the end of the first circuit pattern" means a portion of the first circuit pattern surrounded by a broken line frame A in FIG. 2 to be described later.

In the metal base circuit board according to the present invention, coating with the first insulating layer at the end of the first circuit pattern is formed, for example, through the following process. That is, the method of manufacturing a metal base circuit board according to the present invention includes attaching, by pressure, a first circuit pattern to an uncured first insulating layer so that the uncured first insulating layer covers a lower surface of the first circuit pattern and at least part (the end surface) of a side surface of the first circuit pattern, the lower surface facing the metal base substrate, the at least part of the side surface being adjacent to the lower surface, and thermally curing the uncured insulating layer.

Hereinafter, the present invention will be described in more detail with reference to the drawings.

First Embodiment

Figure 2:
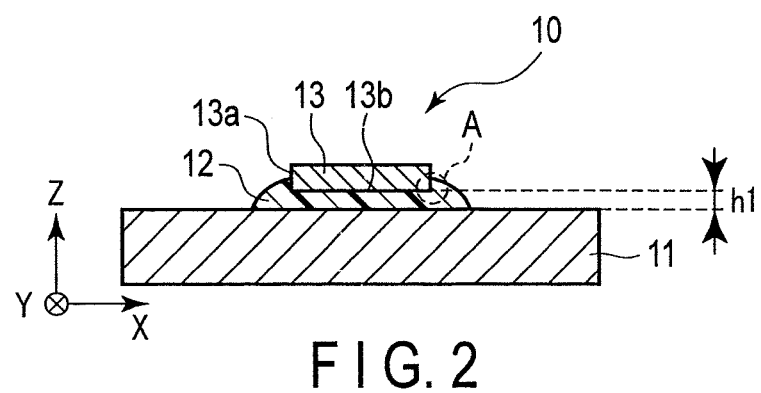
FIG. 2 is a cross-sectional view along line I-I of the metal base circuit board of FIG. 1.

One embodiment of the metal base circuit board of the present invention will be described with reference to FIGS. 1 and 2. The metal base circuit board 10 includes a metal base substrate 11, a first insulating layer 12 formed on the metal base substrate 11 and extending in one direction (Y), and a first circuit pattern 13 formed on the first insulating layer 12 and extending in one direction (Y). Here, although the first insulating layer 12 serves as an adhesive layer of the first circuit pattern 13 and extends in one direction (Y) under the first circuit pattern 13, the present invention is not limited thereto, and for example, the first insulating layer 12 may cover one surface (XY direction) of the metal base substrate 11. In FIGS. 1 and 2 and FIGS. 3 to 6 described later, the X- and Y-directions are parallel to the major surfaces of the metal base substrate 11 and are perpendicular to each other, and the Z direction is a thickness direction perpendicular to the X and Y directions.

In the metal base circuit board 10, an end of the first circuit pattern 13 (a portion surrounded by a broken line frame A in FIG. 2) is covered with the first insulating layer 12. That is, in the metal base circuit board 10, a lower surface 13b of the first circuit pattern 13, which faces the metal base substrate 11, and an end surface (a rising portion from the first insulating layer 12) which is at least part of the side surface 13a of the first circuit pattern 13, which is adjacent to the lower surface 13b are continuously covered with the first insulating layer 12. In the present invention, the shape of the first insulating layer 12 that thus covers the end of the first circuit pattern 13 is referred to as a fillet shape. When the end of the first circuit pattern 13 is covered with the fillet-shaped first insulating layer 12, even if a thickness $h_1$ of the first insulating layer 12 is reduced, occurrence of partial discharge at the end of the first circuit pattern 13 is suppressed, so that a high withstand voltage can be secured.

In the metal base circuit board 10, the thickness $h_1$ (z direction) of the first insulating layer 12 is, for example, preferably 200 μm or less, more preferably from 30 to 200 μm, and still more preferably from 30 to 150 μm. Here, the thickness $h_1$ of the first insulating layer 12 means the thickness of the first insulating layer 12 sandwiched between the lower surface 13b of the first circuit pattern 13 and the metal base substrate 11.

In one embodiment of the present invention, the coverage of the side surface 13a of the first circuit pattern 13 with the first insulating layer 12 is, for example, preferably 5 to 100%, more preferably 25 to 100%, and still more preferably 50 to 100%.

Here, the coverage represents a value (%) obtained by dividing the average height (Z direction) of the side surface 13a of the first circuit pattern 13 covered with the first insulating layer 12 after curing by the average thickness (Z direction) of the first circuit pattern 13. Here, the average height of the side surface 13a of the first circuit pattern 13 covered with the first insulating layer 12 is an average value of five points measured from a SEM image of the cross-section. The average thickness of the first circuit pattern 13 is an average value of five points previously randomly measured by a micrometer before attaching by pressure.

The metal base circuit board 10 shown in FIGS. 1 and 2 can be manufactured, for example, by a manufacturing method including the following process.

First, an uncured first insulating layer 12' is disposed on one surface of the first circuit pattern 13 (process (a1)).

This method is not particularly limited. For example, there may be adopted an aspect (hereinafter referred to as "Aspect 1") in which a liquid insulating composition is coated on one surface of the first circuit pattern 13, processed in advance into a circuit shape, by a known method such as a roll coating method, a bar coating method, a screen printing method, a dispenser method, or a die coating method, whereby the uncured first insulating layer 12' is placed on the first circuit pattern 13.

As another method, there may be adopted an aspect (hereinafter referred to as "Aspect 2") in which the first circuit pattern 13 processed in advance into a circuit shape is disposed on the metal base substrate 11, and a pressure is applied to a gap on the metal base substrate 11, on which the first circuit pattern 13 is not disposed, by a transfer mold method or an autoclave method to pour the liquid insulating composition into the gap, whereby the uncured first insulating layer 12' is placed between the metal base substrate 11 and the first circuit pattern 13. The uncured first insulating layer 12' also functions as an adhesive between the first circuit pattern 13 and the metal base substrate 11.

Then, the uncured first insulating layer 12' formed in the process (a1) and the first circuit pattern 13 are attached by pressure (process (a2)).

According to the above-described Aspect 1, when the uncured first insulating layer 12' is disposed on one surface of the first circuit pattern 13, the first circuit pattern 13 provided with the uncured first insulating layer 12' is attached to the metal base substrate 11 by pressure such that the uncured first insulating layer 12' is interposed between the first circuit pattern 13 and the metal base substrate 11 to form a fillet shape according to an uncured insulating layer at an end of the first circuit pattern 13.

According to the above-described Aspect 2, when the uncured first insulating layer 12' is placed between the metal base substrate 11 and the first circuit pattern 13, the first circuit pattern 13 is attached, by pressure, to the metal base substrate 11 to form a fillet shape of an uncured insulating layer at the end of the first circuit pattern 13.

As a degree of attachment under pressure, it is preferable that attaching by pressure is performed such that the coverage of the side surface 13a of the first circuit pattern 13 with the first insulating layer 12 after curing is within the above range.

Then, the uncured first insulating layer 12' is thermally cured (process (a3)). Consequently, the metal base circuit board 10 in which the end of the first circuit pattern 13 is covered with the fillet-shaped first insulating layer 12 as shown in FIGS. 1 and 2 is obtained.

In the thermal curing process (a3), it is not necessary to apply pressure. In the metal base circuit board 10 of the present invention, the end of the first circuit pattern 13 is covered with the fillet-shaped insulating layer 12, so that the occurrence of partial discharge at the end of the first circuit pattern 13 is suppressed; therefore, even if pressure is not applied in the thermal curing process (a3), a metal base circuit board with good withstand voltage characteristics can be obtained. When it is not necessary to perform heating in the thermal curing process (a3), since a heating device and auxiliary materials necessary therefor (cushion material or the like) are not required, it is advantageous from the viewpoint of production cost.

In the metal base circuit board 10 of the present invention, the insulating layer 12 plays a role of electrically insulating the first circuit pattern 13 from the metal base substrate 11 and also plays a role as an adhesive for laminating the first circuit pattern 13 and the metal base substrate 11 with each other. Thus, a resin is generally used for the first insulating layer 12. Since the insulating layer 12 needs to have high heat resistance against high heat generating properties of the first circuit pattern 13 and high heat transferability for transferring this heat to the metal base substrate 11, the insulating layer 12 preferably further contains an inorganic filler.

Examples of matrix resin of the first insulating layer 12 include epoxy resins such as bisphenol A type epoxy resin, bisphenol F type epoxy resin, and triazine type epoxy resin; and cyanate resins such as bisphenol E type cyanate resin, bisphenol A type cyanate resin, and novolak type cyanate resin, and these resins can be used alone or in combination of two or more.

As described above, coating at least the end surface of the side face of the first circuit pattern with the first insulating layer is formed by attaching, under pressure, the first circuit pattern to the uncured first insulating layer. In the thermal curing process for the uncured first insulating layer, it is not necessary to apply pressure. Thus, the resin is required to have such a performance that allows a fillet shape to be easily formed at the end of the first circuit pattern by attaching under pressure and enables voidless adhesion in thermal curing under no pressure.

From this viewpoint, it is preferable that the matrix resin is a resin satisfying at least one of the following requirements: the resin is in a liquid state at ordinary temperature; the melt viscosity is low; and the curing rate is not too fast. Specifically, the resin preferably has a low vapor pressure, and, for example, it is preferable that the resin is a liquid resin not boiled at 25° C. and 1 kPa. In addition, the viscosity of the resin is preferably low, and, for example, the viscosity in the state of not containing an additive such as an inorganic filler is preferably 10 Pa·s or less at 25° C. When the inorganic filler such as alumina or silica is added, the resin is preferably a slurry having a viscosity of 1 to 50 Pa·s.

From the viewpoint of heat resistance, the matrix resin preferably has a high glass transition point (Tg) after curing, and, for example, the glass transition point is preferably 175° C. or more, more preferably 200° C. or more, and still more preferably 250° C. or more. Although the upper limit value of Tg is not particularly limited, it is preferably, for example, 400° C. or less. Here, Tg is the peak value of Tan δ measured by a dynamic viscoelasticity measuring device (DMA).

As specific matrix resins, for example, it is preferable to use at least one selected from cyanate resins such as bisphenol E type cyanate resin, bisphenol A type cyanate resin, and novolac type cyanate resin, and it is more preferable to use at least the bisphenol E type cyanate resin.

In one embodiment of the present invention, the first insulating layer 12 contains at least bisphenol E type cyanate resin, and the content ratio thereof is preferably 50 to 100% by volume, more preferably from 60 to 100% by volume, still more preferably from 70 to 100% by volume based on the total amount of the resin contained in the first insulating layer 12.

As described above, the first insulating layer 12 preferably contains a resin and an inorganic filler. As the inorganic filler, those having excellent electrical insulation properties and high thermal conductivity are preferable, and examples of the inorganic fillers include alumina, silica, aluminum nitride, boron nitride, silicon nitride, and magnesium oxide. It is preferable to use one, or two or more kinds selected from them.

The content ratio of the inorganic filler in the first insulating layer 12 can be appropriately set according to the kind of the inorganic filler. For example, the content ratio is preferably 70% by volume or less, more preferably 30 to 70% by volume based on the total volume of the matrix resin contained in the first insulating layer 12.

In addition to the matrix resin and the inorganic filler described above, the first insulating layer 12 may further contain, for example, a coupling agent, a dispersant, and the like.

The metal base substrate 11 concludes, for example, a simple metal or an alloy. As the material of the metal base substrate 11, aluminum, iron, copper, an aluminum alloy or stainless steel can be used, for example. The metal base substrate 11 may further contain a nonmetal, such as carbon. For example, the metal base substrate 11 may contain an aluminum complexed with carbon. Further, the metal base substrate 11 may have a monolayer structure or a multilayer structure.

The metal base substrate 11 has a high thermal conductivity. The metal base substrate 11 typically has a thermal conductivity of 60 $W·m^{-1}·K^{-1}$ or higher.

The metal base substrate 11 may be flexible or nonflexible. The thickness of the metal base substrate 11 is, for example; in the range of 0.2 to 5 mm.

The first circuit pattern 13 includes, for example, a simple metal or an alloy. As the material of the first circuit pattern 13, copper or aluminum can be used, for example. The thickness of the first circuit pattern 13 is, for example, in the range of 10 to 500 μm.

Second Embodiment

Another embodiment of the metal base circuit board of the present invention will be described with reference to FIGS. 3 and 4. A metal base circuit board 20 includes a metal base substrate 21, a second insulating layer 24 formed on one surface (XY direction) which is a circuit surface of the metal base substrate 21, a second circuit pattern 25 formed on the second insulating layer 24 and extending in one direction (Y), a first insulating layer 22 formed on the second circuit pattern 25 and extending in one direction (Y), and a first circuit pattern 23 formed on the first insulating layer 22 and extending in one direction (Y). Here, although the first insulating layer 22 serves as an adhesive layer of the first circuit pattern 23 and extends in one direction (Y) under the first circuit pattern 23, the present invention is not limited thereto, and for example, the first insulating layer 22 may cover one surface (XY direction) of the second circuit pattern 25.

In the metal base circuit board 20, an end of the first circuit pattern 23 (a portion surrounded by a broken line frame A in FIG. 4) is covered with the first insulating layer 22. That is, in the metal base circuit board 20, a lower surface 23b of the first circuit pattern 23, which faces the metal base substrate 21, and an end surface (a rising portion from the first insulating layer 22) which is at least part of a side surface 23a of the first circuit pattern 23, which is adjacent to the lower surface 23b are continuously covered with the first insulating layer 22. When the end of the first circuit pattern 23 is covered with the fillet-shaped first insulating layer 22, even if a thickness $h_2$ of the first insulating layer 22 is reduced, occurrence of partial discharge at the end of the first circuit pattern 23 is suppressed, so that a high withstand voltage can be secured.

In the metal base circuit board 20, the preferable range of the thickness $h_2$ (z direction) of the first insulating layer 22 is the same as the preferable range of the thickness $h_1$ (z direction) of the first insulating layer 12 in the metal base circuit board 10 described above.

In the metal base circuit board 20, the preferable range of the coverage of the side surface 23a of the first circuit pattern 23 with the first insulating layer 22 is the same as the preferable range of the coverage with the first insulating layer 12 in the metal base circuit board 10 described above.

Figure 3:
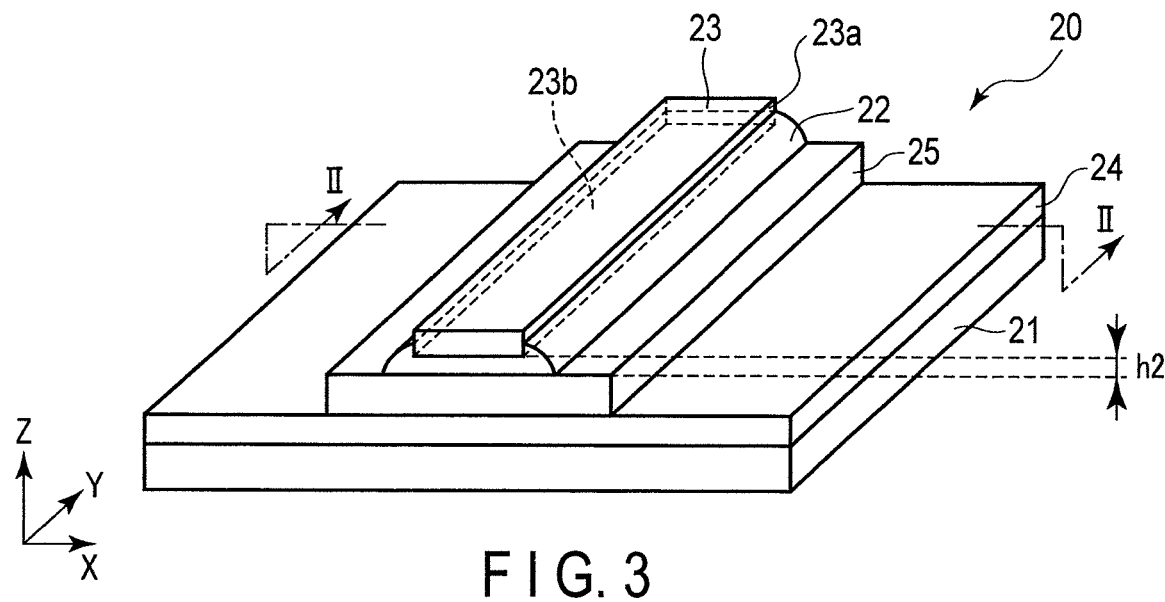
FIG. 3 is a cross-sectional perspective view schematically showing a metal base circuit board according to another embodiment of the present invention.
Figure 4:
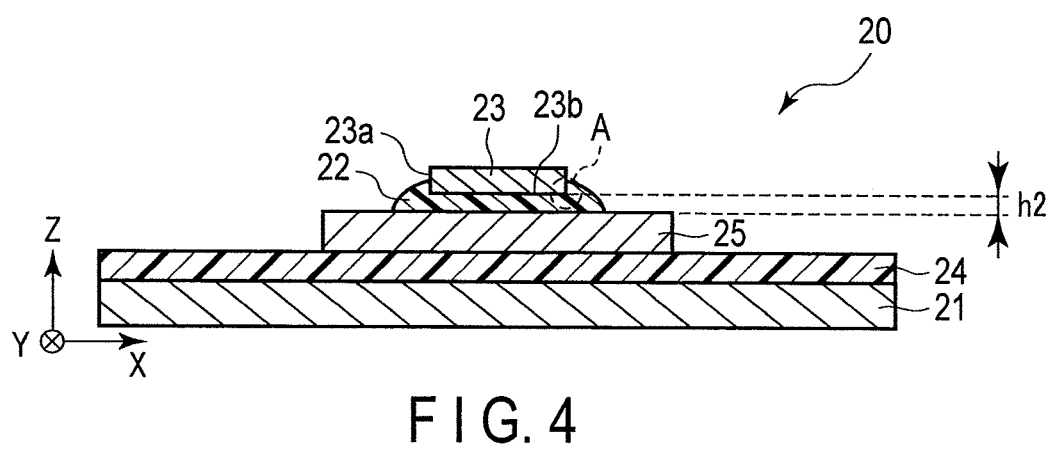
FIG. 4 is a cross-sectional view along line II-II of the metal base circuit board of FIG. 3.

The metal base circuit board 20 shown in FIGS. 3 and 4 can be obtained, for example, by a manufacturing method including the following processes (b1), (b2), (b3), and (b4).

<Process (b1)>

A single-layer metal base circuit board including the metal base substrate 21, the second insulating layer 24 formed on the metal base substrate 21, and the second circuit pattern 25 formed on the second insulating layer 24 is manufactured (process (b1)). The single-layer metal base circuit board can be manufactured by a known method.

For example, a liquid insulating composition is applied onto at least one of the metal base substrate 21 and a metal foil before patterning of the second circuit pattern 25 by a known method such as a roll coating method, a bar coating method, or a screen printing method, whereby an uncured second insulating layer 24' is formed.

Then, the metal base substrate 21 and the metal foil are superposed so as to face each other with the uncured second insulating layer 24' interposed therebetween, and the uncured second insulating layer 24' is cured by pressurizing and heating treatment. Then, the metal foil is patterned to form the second circuit pattern 25, thereby obtaining a single-layer metal base circuit board.

In the above-described embodiment, the uncured second insulating layer 24' is formed by applying the liquid insulating composition onto at least either the metal base substrate 21 or the metal foil. However, in another embodiment, a coating film may be formed in advance by applying the liquid insulating composition onto a base material, such as a PET film, and drying, and then to be thermally transferred to the metal base substrate 21 or the metal foil.

<Process (b2)>

An uncured first insulating layer 22' is disposed on one surface of the first circuit pattern 23 processed in advance into a circuit shape (process (b2)).

This method is not particularly limited, and can be carried out in accordance with Aspect 1 or Aspect 2 described in the method of manufacturing the metal base circuit board 10 described above. That is, there may be adopted an aspect (hereinafter referred to as "Aspect 3") in which a liquid insulating composition is applied onto one surface of the first circuit pattern 23 by the above-described known method, whereby the uncured first insulating layer 22' is placed on one surface of the first circuit pattern 23. Alternatively, there may be adopted an aspect (hereinafter referred to as "Aspect 4") in which the first circuit pattern 23 is disposed on the second circuit pattern 25 in the single-layer metal base circuit board obtained in the above-described process (b1), and a pressure is applied to a gap on the second circuit pattern 25, on which the first circuit pattern 23 is not disposed, by a transfer mold method or an autoclave method to pour the liquid insulating composition into the gap, whereby the uncured first insulating layer 22' is placed between the second circuit pattern 25 and the first circuit pattern 23.

<Process (b3)>

The uncured first insulating layer 22' formed in the process (b2) and the first circuit pattern 23 are attached by pressure (process (b3)).

According to the above-described Aspect 3, when the uncured first insulating layer 22' is disposed on one surface of the first circuit pattern 23, the first circuit pattern 23 provided with the uncured first insulating layer 22' is attached, by pressure, to the second circuit pattern 25 such that the uncured first insulating layer 22' is interposed between the first circuit pattern 23 and the second circuit pattern 25 to form a fillet shape according to an uncured insulating layer at an end of the first circuit pattern 23.

According to the above-described Aspect 4, when the uncured first insulating layer 22' is placed between the second circuit pattern 25 and the first circuit pattern 23, the first circuit pattern 23 is attached, by pressure, to the second circuit pattern 25 to form a fillet shape of an uncured insulating layer at the end of the first circuit pattern 23.

As a degree of attachment under pressure, it is preferable that attaching by pressure is performed such that the coverage of the side surface 23a of the first circuit pattern 23 with the first insulating layer 22 after curing is within the above range.

<Process (b4)>

Then, the uncured first insulating layer 22' is thermally cured (process (b4)). Consequently, the metal base circuit board 20 in which the end of the first circuit pattern 23 is covered with the fillet-shaped first insulating layer 22 as shown in FIGS. 3 and 4 is obtained. In the heating process (b4), it is not necessary to apply pressure.

In the metal base circuit board 20 of the present invention, the first insulating layer 22 and the second insulating layer 24 are required to have high insulating properties, adhesiveness, heat resistance, and heat transferability, similarly to the first insulating layer 12 in the metal base circuit board 10 described above. Thus, the first insulating layer 22 and the second insulating layer 24 generally contain a resin, and preferably further contain an inorganic filler. In addition to an inorganic filler and a matrix resin, the first insulating layer 22 and the second insulating layer 24 may further contain, for example, a coupling agent, a dispersant, and the like.

Similarly to the first insulating layer 12 in the metal base circuit board 10, the first insulating layer 22 in an uncured state is attached, by pressure, to the first circuit pattern 23 to form a fillet shape, so that the end of the first circuit pattern 23 is covered. Thus, a preferred aspect of the first insulating layer 22 is the same as the preferred aspect of the first insulating layer 12 in the metal base circuit board 10 described above.

On the other hand, a resin to be used as a matrix in the second insulating layer 24 is not particularly limited as long as it is a resin which can impart insulating properties and which exhibits adhesiveness and does not thermally decompose by the heating and pressurizing treatment described above. Examples of such a resin include polyamide imide, liquid crystal polyester, polyether ether ketone, polysulfone, polyphenylsulfone, polyethersulfone, polyphenylene sulfide, epoxy resin, imide resin, cyanate resin, bismaleimide resin, and benzoxazine resin, and these resins can be used alone or in combination. Specific examples of the inorganic filler that can be dispersed in the matrix resin are the same as the specific examples of the inorganic filler that can be contained in the first insulating layer 12 in the metal base circuit board 10 described above. The content ratio of this inorganic filler is, for example, preferably 40 to 80% by volume, more preferably 50 to 80% by volume based on the matrix resin.

The thickness of the second insulating layer 24 is preferably 80 μm or more, more preferably 80 to 200 μm, from the viewpoint of ensuring insulation properties and the like.

In the metal base circuit board 20 of the present invention, the metal base substrate 21 is as described above for the metal base substrate 11 of the metal base circuit board 10 described above, and the first circuit pattern 23 and the second circuit pattern 25 are as described above for the first circuit pattern 13 of the metal base circuit board 10.

Third Embodiment

Still another embodiment of the metal base circuit board of the present invention will be described with reference to FIGS. 5 and 6. A metal base circuit board 30 includes a metal base substrate 31, a second insulating layer 34 formed on one surface which is a circuit surface of the metal base substrate 31 and extending in one direction (Y), a second circuit pattern 35 formed on the second insulating layer 34 and extending in one direction (Y), a first insulating layer 32 formed on the second circuit pattern 35 and extending in one direction (Y), and a first circuit pattern 33 formed on the first insulating layer 32 and extending in one direction (Y). Here, although the first insulating layer 32 serves as an adhesive layer of the first circuit pattern 33 and extends in one direction (Y) under the first circuit pattern 33, the present invention is not limited thereto, and for example, the first insulating layer 32 may cover one surface (XY direction) of the second circuit pattern 35. Similarly, the second insulating layer 34 may cover one surface (XY direction) of the metal base substrate 31.

In the metal base circuit board 30, an end of the first circuit pattern 33 (a portion surrounded by a broken line frame A1 in FIG. 6) is covered with the first insulating layer 32. That is, a lower surface 33b of the first circuit pattern 33, which faces the metal base substrate 31, and an end surface (a rising portion from the first insulating layer 32) which is at least part of a side surface 33a of the first circuit pattern 33, which is adjacent to the lower surface 33b are continuously covered with the first insulating layer 32.

Further, in the metal base circuit board 30, an end of the second circuit pattern 35 (a portion surrounded by a broken line frame A2 in FIG. 6) is covered with the second insulating layer 34. That is, a lower surface 35b of the second circuit pattern 35, which faces the metal base substrate 31, and an end surface (a rising portion from the second insulating layer 34) which is at least part of a side surface 35a of the second circuit pattern 35, which is adjacent to the lower surface 35b are continuously covered with the second insulating layer 34.

As described above, when the end of the first circuit pattern 33 and the end of the second circuit pattern 35 are covered with the fillet-shaped first and second insulating layers 32 and 34, even if a thickness $h_3$ of the first insulating layer 32 and a thickness $h_4$ of the second insulating layer 34 are reduced, occurrence of partial discharge at each end of the first and second circuit patterns 33 and 35 is suppressed, so that a high withstand voltage can be secured.

In the metal base circuit board 30, each preferable range of the thickness $h_3$ (z direction) of the first insulating layer 32 and the thickness $h_4$ (z direction) of the second insulating layer 34 is the same as the preferable range of the thickness $h_1$ (z direction) of the first insulating layer 12 in the metal base circuit board 10 described above.

In the metal base circuit board 30, each preferable range of the coverage of the side surface 33a of the first circuit pattern 33 with the first insulating layer 32 and the coverage of the side surface 35a of the second circuit pattern 35 with the second insulating layer 34 is the same as the preferable range of the coverage with the first insulating layer 12 in the metal base circuit board 10 described above.

Figure 6:
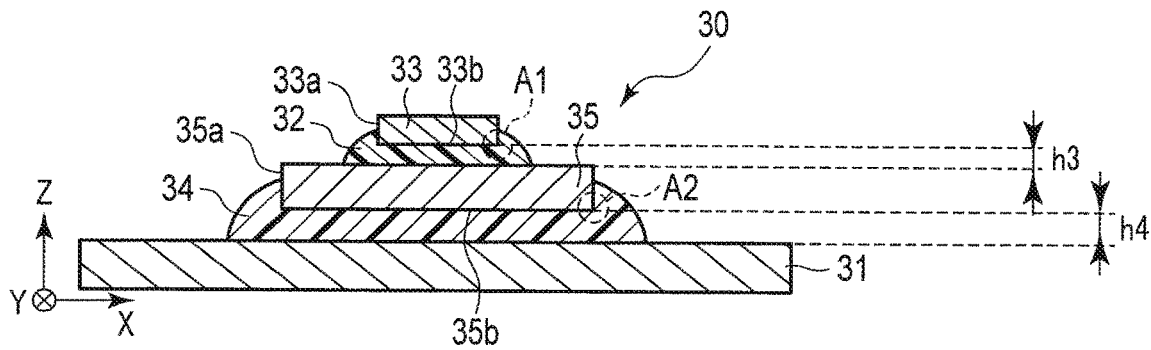
FIG. 6 is a cross-sectional view along line III-III of the metal base circuit board of FIG. 5.

The metal base circuit board 30 shown in FIGS. 5 and 6 can be obtained, for example, by a manufacturing method including the following processes (c1-1), (c1-2), (c2-1), (c2-2), and (c3).

<Process (c1-1)>

An uncured first insulating layer 32' is disposed on one surface of the first circuit pattern 33 processed in advance into a circuit shape (process (c1-1)). This method is not particularly limited, and can be carried out in accordance with Aspect 1 or Aspect 2 described in the method of manufacturing the metal base circuit board 10 described above.

<Process (c1-2)>

The uncured first insulating layer 32' formed in the process (c1-1) and the first circuit pattern 33 are attached by pressure(process (c1-2)). For example, the first circuit pattern 33 and the second circuit pattern 35 processed in advance into a circuit shape are attached by pressure to sandwich the uncured first insulating layer 32' in between by a method in accordance with the process (a2) described in the method of manufacturing the metal base circuit board 10, whereby a fillet shape of the uncured insulating layer 32' is formed at the end of the first circuit pattern 33.

<Process (c2-1)>

An uncured second insulating layer 34' is disposed on one surface of the second circuit pattern 35 processed in advance into a circuit shape (process (c2-1)). This method is not particularly limited, and can be carried out in accordance with Aspect 1 or Aspect 2 described in the method of manufacturing the metal base circuit board 10 described above.

<Process (c2-2)>

The uncured second insulating layer 34' formed in the process (c2-1) and the second circuit pattern 35 are attached by pressure (process (c2-2)). For example, the second circuit pattern 35 and the metal base substrate 31 are attached by pressure to sandwich the uncured second insulating layer 34' in between by the method in accordance with the process (a2) described in the method of manufacturing the metal base circuit board 10, whereby a fillet shape of the uncured insulating layer 34' is formed at the end of the second circuit pattern 35.

The process of forming the fillet shape of the uncured insulating layer 32' at the end of the first circuit pattern 33 by the processes (c1-1) and (c1-2) described above and the process of forming the fillet shape of the uncured insulating layer 34' at the end of the second circuit pattern 35 by the processes (c2-1) and (c2-2) can be performed in any order.

<Process (c3)>

The uncured two insulating layers are cured by heating (process c3). Although the process of thermally curing the uncured first insulating layer 32' and the process of thermally curing the uncured second insulating layer 34' may be carried out simultaneously or separately, it is preferable, from the viewpoint that the thermal history is constant, that the processes are carried out simultaneously.

In the thermal curing process (c3), it is not necessary to apply pressure. In the metal base circuit board 30 of the present invention, the fillet-shaped insulating layers 32 and 34 are formed at the respective ends of the first circuit pattern 33 and the second circuit pattern 35, so that the occurrence of partial discharge at each end of the first circuit pattern 33 and the second circuit pattern 35 is suppressed; therefore, even if pressure is not applied in the thermal curing process (c3), a metal base circuit board with good withstand voltage characteristics can be obtained.

In the metal base circuit board 30 of the present invention, the first insulating layer 32 and the second insulating layer 34 are required to have high insulating properties, adhesiveness, heat resistance, and heat transferability, similarly to the first insulating layer 12 in the metal base circuit board 10. Thus, the first insulating layer 32 and the second insulating layer 34 generally contain a resin, and preferably further contain an inorganic filler. In addition to an inorganic filler and a matrix resin, the first insulating layer 32 and the second insulating layer 34 may further contain, for example, a coupling agent, a dispersant, and the like.

Similarly to the first insulating layer 12 in the metal base circuit board 10, the first insulating layer 32 and the second insulating layer 34 are attached by pressure in an uncured state to form a fillet shape, so that the ends of the first circuit pattern 33 and the second circuit pattern 35 are covered. In the thermal curing process for each uncured insulating layer, heating is not required.

Thus, the resin contained in the first insulating layer 32 and the second insulating layer 34 is required to have the same performance as that of the resin contained in the first insulating layer 12 in the metal base circuit board 10, and the preferable examples thereof are also the same.

Specific examples of the inorganic filler that may be contained in the first insulating layer 32 and the second insulating layer 34 and the content ratio thereof are the same as those of the first insulating layer 12 in the metal base circuit board 10 described above.

In the metal base circuit board 30 of the present invention, the metal base substrate 31 is as described above for the metal base substrate 11 of the metal base circuit board 10 described above, and the first circuit pattern 33 and the second circuit pattern 35 are as described above for the first circuit pattern 13 of the metal base circuit board 10.

EXAMPLES

Examples of the present invention will be described below. However, the present invention is not limited to the examples.

[Preparation of Insulating Resin Composition]

Spherical silica was added such that the content ratio was 60% by volume based on the total volume of the resin shown in Table 1 below, and then mixed with a planetary stirrer to prepare a resin solution. The obtained resin solution was degassed under reduced pressure at 25° C. and 1 kPa to obtain an insulating resin composition. Tg shown in Table 1 is a glass transition point of each insulating resin composition obtained by the following method.

*Method of Measuring Tg

Each insulating resin composition was sandwiched between 2 mm thick copper plates which had been subjected to release treatment and cured at 200° C. to produce a sheet having a thickness of about 200 μm. A sample cut out from this sheet into a 3×50 mm strip was used as a sample for DMA measurement, and Tg was determined from the peak of tan δ.

[Production of Metal Base Circuit Board]

The insulating resin composition prepared above was applied onto one surface of a 1.0 mm thick circuit copper plate processed into an arbitrary circuit shape such that the thickness after attaching by pressure and curing was 100 μm, thus forming an insulating layer in an uncured state. Then, this was placed on a 1.0 mm thick base copper plate so as to sandwich the uncured insulating layer in between, and attached by pressure. Then, the base copper plate with the circuit copper plate attached by pressure thereon was heated in an oven to cure the insulating layer and thus to obtain a metal base circuit board.

With respect to each metal base circuit board thus obtained, withstand voltage, solder heat resistance, and moisture-absorption solder heat-resistance were evaluated by the following evaluation method. The results are shown together with the coverage of the side surface of the circuit copper plate with the insulating layer after curing.

Here, the coverage represents a value (%) obtained by dividing the average height of the side surface of the circuit copper plate covered with the insulating layer after curing by the average thickness of the circuit copper plate. The average thickness of the circuit copper plate is an average value of five points randomly measured by a micrometer before attaching by pressure. The average height of the side surface of the circuit copper plate covered with the insulating layer after curing is an average value of five points randomly measured from a SEM image of the cross-section.

[Production of Metal Base Circuit Board for Comparison]

Each insulating resin composition was applied onto one surface of a copper plate such that the thickness after heating and pressurization was 100 μm and semi-cured to such an extent that the fluidity was lost, whereby a copper plate with prepreg was produced. A 1.0 mm thick circuit copper plate processed into an arbitrary circuit shape from the copper plate with prepreg was placed on a 1.0 mm thick base copper plate so as to sandwich the semi-cured insulating layer in between and adhered by heating and pressurization, and a metal base circuit board for comparison having a coverage of 0% was obtained.

<Evaluation Method>
[Withstand Voltage]
B010 manufactured by Mitsubishi Cable Industries, Ltd. was used, and the test voltage was started at 0.5 kV. The voltage was increased by 0.5 kV for each completion, and the voltage at the time of dielectric breakdown was defined as the withstand voltage (dielectric breakdown voltage) (BDV). The measurement conditions were as follows: a pressure rising time to the test voltage was 25 seconds; a holding time was 5 seconds; and a pressure lowering time was 15 seconds. The results are shown in Table 2.

[Solder Heat Resistance]
The solder heat resistance is a test assuming a reflow treatment when mounting electronic components on a circuit board. In the test, a metal base circuit board was floated in a solder bath at 280° C. for 5 minutes, and then BDV was measured in accordance with the above-described measurement conditions of the withstand voltage. When BDV is less than 2 kV, x was marked, when BDV is 2.0 kV or more and less than 3.0 kV, Δ was marked, and when BDV is 3.0 kV or more, ○ was marked. The results are shown in Table 2.

[Moisture-Absorption Solder Heat-Resistance]
The moisture-absorption solder heat-resistance is a test assuming a reflow treatment when mounting electronic components on a circuit board. In the test, a metal base circuit board was allowed to absorb moisture for three hours under conditions of a temperature of 40° C. and a humidity of 98%. Then, the metal base circuit board was floated in a solder bath at 280° C. for 5 minutes, and then BDV was measured in accordance with the above-described measurement conditions of the withstand voltage. When BDV is less than 2 kV, x was marked, when BDV is 2.0 kV or more and less than 3.0 kV, Δ was marked, and when BDV is 3.0 kV or more, ○ was marked. The results are shown in Table 2.

TABLE 1

| Insulating comp. | Resin A | Resin B (20 mass % relative to resin A) | Inorganic filler (60 vol. % relative to resin) | Tg (° C.) |
| --- | --- | --- | --- | --- |
| R1 | Bisphenol A type epoxy resin | — | Spherical silica | 176 |
| R2 | Bisphenol E type cyanate resin | — | Spherical silica | 253 |
| R3 | Bisphenol E type cyanate resin | Bisphenol A type epoxy resin | Spherical silica | 204 |
| R4 | Bisphenol E type cyanate resin | Bisphenol A type cyanate resin | Spherical silica | 255 |
| R5 | Bisphenol E type cyanate resin | Novolak type cyanate resin | Spherical silica | 278 |

TABLE 2

| | Insulating comp. | Coverage (%) | Withstand voltage (kV) | Solder Heat Resistance | Moisture-absorption solder heat-resistance |
| --- | --- | --- | --- | --- | --- |
| Ex. 1 | R1 | 50 | 4.5 | ○ | Δ |
| Ex. 2 | R2 | 50 | >5.0 | ○ | ○ |
| Ex. 3 | R3 | 50 | 5.0 | ○ | ○ |
| Ex. 4 | R4 | 50 | >5.0 | ○ | ○ |
| Ex. 5 | R5 | 50 | >5.0 | ○ | ○ |
| Ex. 6 | R1 | 100 | 4.5 | ○ | ○ |
| Ex. 7 | R1 | 75 | 4.5 | ○ | ○ |
| Ex. 8 | R1 | 25 | 3.5 | ○ | Δ |
| Ex. 9 | R1 | 5 | 3.0 | ○ | Δ |
| Ex. 10 | R2 | 100 | >5.0 | ○ | ○ |
| Ex. 11 | R2 | 75 | >5.0 | ○ | ○ |
| Ex. 12 | R2 | 25 | 5.0 | ○ | ○ |
| Ex. 13 | R2 | 5 | 4.0 | ○ | ○ |
| Ex. 14 | R5 | 100 | >5.0 | ○ | ○ |
| Ex. 15 | R5 | 75 | >5.0 | ○ | ○ |
| Ex. 16 | R5 | 25 | 4.5 | ○ | ○ |
| Ex. 17 | R5 | 5 | 4.0 | ○ | ○ |
| Comp. Ex. 1 | R1 | 0 | 1.0 | x | x |
| Comp. Ex. 2 | R2 | 0 | 2.5 | Δ | Δ |
| Comp. Ex. 3 | R5 | 0 | 2.0 | Δ | Δ |

The invention claimed is:

1. A metal base circuit board comprising:
a metal base substrate;
a first circuit pattern; and
a first insulating layer between an upper surface of the metal base substrate and the first circuit pattern, the upper surface of the metal base substrate facing the first circuit pattern, and the first insulating layer containing a resin and an inorganic filler,
wherein the metal base substrate has a monolayer structure,
wherein the first insulating layer covers a lower surface of the first circuit pattern and part but not all of a side surface of the first circuit pattern, the lower surface facing the metal base substrate, and the part of the side surface being adjacent to the lower surface,
wherein the first insulating layer has a fillet shape at a portion thereof covering an end of the first circuit pattern where the lower surface and the side surface of the first circuit pattern meet,
wherein a coverage of the side surface of the first circuit pattern with the first insulating layer is at least 5%,
wherein a thickness of the first insulating layer, excluding a part of the first insulating layer that covers the lower surface of the first circuit pattern, is greatest at a portion of the first insulating layer where the fillet shape is in contact with the side surface of the first circuit pattern, and decreases as a distance from the first circuit pattern increases,
wherein the first insulating layer covers part of the upper surface of the metal base substrate in a state of being in contact with the part of the upper surface of the metal base substrate, the part of the upper surface including a region corresponding to the lower surface of the first circuit pattern, and the upper surface of the metal base substrate has exposed portions that are not coated with the first insulating layer, and
wherein a thickness of the first insulating layer is 30 to 200 μm.

2. The metal base circuit board according to claim 1, wherein the first insulating layer contains at least bisphenol E type cyanate resin as the resin.

3. The metal base circuit board according to claim 2, wherein a ratio of the bisphenol E type cyanate resin contained in the first insulating layer is 50% by mass or more based on a total mass of the resin.

4. The metal base circuit board according to claim 1, wherein a ratio of the inorganic filler contained in the first insulating layer is 70% by volume or less based on a total volume of the resin.

5. The metal base circuit board according to claim 1, wherein the end of the first circuit pattern is rectangular.

6. The metal base circuit board according to claim 1, wherein the metal base substrate has a thermal conductivity of 60 $W \cdot m^{-1} \cdot K^{-1}$ or higher.

7. A method of manufacturing the metal base circuit board according to claim 1, the method comprising:
- attaching, by pressure, the first circuit pattern to the first insulating layer in an uncured state so that the uncured first insulating layer covers the lower surface of the first circuit pattern and the at least part of the side surface of the first circuit pattern; and
- thermally curing the uncured first insulating layer.

\* \* \* \* \*